United States Patent
Iwamoto

(10) Patent No.: US 10,594,297 B2
(45) Date of Patent: Mar. 17, 2020

(54) PIEZOELECTRIC DEVICE AND MANUFACTURING METHOD THEREFOR

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 361 days.

(21) Appl. No.: 15/465,631

(22) Filed: Mar. 22, 2017

(65) Prior Publication Data

US 2017/0194937 A1 Jul. 6, 2017

Related U.S. Application Data

(63) Continuation of application No. PCT/JP2015/078715, filed on Oct. 9, 2015.

(30) Foreign Application Priority Data

Oct. 17, 2014 (JP) .................................. 2014-212169

(51) Int. Cl.
*H03H 9/25* (2006.01)
*H03H 9/05* (2006.01)
(Continued)

(52) U.S. Cl.
CPC ............... *H03H 9/25* (2013.01); *H01L 41/04* (2013.01); *H01L 41/22* (2013.01); *H03H 3/08* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 5,818,145 | A | 10/1998 | Fukiharu |
| 2004/0000840 | A1 | 1/2004 | Higuchi et al. |

(Continued)

FOREIGN PATENT DOCUMENTS

| | | |
|---|---|---|
| CN | 101280412 A | 10/2008 |
| JP | 11-340777 A | 12/1999 |

(Continued)

OTHER PUBLICATIONS

Official Communication issued in corresponding International Application PCT/JP2015/078715, dated Nov. 10, 2015.

(Continued)

*Primary Examiner* — Bryan P Gordon
(74) *Attorney, Agent, or Firm* — Keating & Bennett, LLP

(57) ABSTRACT

A piezoelectric device includes a first piezoelectric substrate, a second piezoelectric substrate and an adhesive layer. First conductor patterns are provided on a front surface of the first piezoelectric substrate. A first piezoelectric element is defined by the first conductor patterns. Second conductor patterns are provided on a front surface of the second piezoelectric substrate. A second piezoelectric element is provided of these patterns. The adhesive layer adheres a rear surface of the first piezoelectric substrate and a rear surface of the second piezoelectric substrate to each other. The adhesive layer adheres the first and second substrates to each other such that a compressive stress is applied to the first and second piezoelectric substrates in a bonded state.

20 Claims, 5 Drawing Sheets

(51) Int. Cl.
*H03H 9/02* (2006.01)
*H03H 9/10* (2006.01)
*H03H 3/08* (2006.01)
*H03H 9/145* (2006.01)
*H01L 41/04* (2006.01)
*H01L 41/22* (2013.01)
*H01L 41/053* (2006.01)
*H01L 41/18* (2006.01)
*H01L 41/313* (2013.01)
*H01L 41/08* (2006.01)

(52) U.S. Cl.
CPC .... *H03H 9/02055* (2013.01); *H03H 9/02866* (2013.01); *H03H 9/059* (2013.01); *H03H 9/1085* (2013.01); *H03H 9/145* (2013.01); *H01L 41/0533* (2013.01); *H01L 41/0815* (2013.01); *H01L 41/18* (2013.01); *H01L 41/313* (2013.01)

(56) References Cited

U.S. PATENT DOCUMENTS

| | | | | |
|---|---|---|---|---|
| 2004/0136117 A1* | 7/2004 | Kuwajima | ........... | G11B 5/5552 360/294.4 |
| 2006/0290233 A1* | 12/2006 | Nishiyama | ............... | H03H 3/08 310/313 R |
| 2007/0041595 A1* | 2/2007 | Carazo | ................... | H04R 17/00 381/151 |
| 2007/0080757 A1* | 4/2007 | Yahata | ................. | H03H 9/0571 333/133 |
| 2009/0212399 A1* | 8/2009 | Kaneda | .................... | H03H 3/08 257/620 |
| 2011/0266918 A1* | 11/2011 | Iwamoto | .................. | H03H 3/08 310/313 B |
| 2012/0086312 A1* | 4/2012 | Kobayashi | ............... | H03H 3/10 310/348 |
| 2012/0117769 A1* | 5/2012 | Ohnishi | ................ | H01L 41/257 29/25.35 |
| 2013/0033150 A1* | 2/2013 | Bardong | ............... | C23C 14/024 310/313 R |
| 2014/0191620 A1* | 7/2014 | Melcher | ............. | H01L 41/0472 310/363 |
| 2015/0008789 A1* | 1/2015 | Iwamoto | .................. | H03H 3/10 310/313 R |
| 2015/0256144 A1* | 9/2015 | Andosca | ............. | H01L 41/1134 310/323.21 |

FOREIGN PATENT DOCUMENTS

| | | |
|---|---|---|
| JP | 2000-049563 A | 2/2000 |
| JP | 2001-053579 A | 2/2001 |
| JP | 2003-289230 A | 10/2003 |
| JP | 2007-060465 A | 3/2007 |
| JP | 2007-110202 A | 4/2007 |
| JP | 2012-085286 A | 4/2012 |
| WO | 2010/103713 A1 | 9/2010 |

OTHER PUBLICATIONS

Official Communication issued in Chinese Patent Application No. 201580049496.4, dated Dec. 4, 2019.

* cited by examiner

PIEZOELECTRIC DEVICE AND MANUFACTURING METHOD THEREFOR

CROSS REFERENCE TO RELATED APPLICATIONS

This application claims the benefit of priority to Japanese Patent Application No. 2014-212169 filed on Oct. 17, 2014 and is a Continuation Application of PCT Application No. PCT/JP2015/078715 filed on Oct. 9, 2015. The entire contents of each application are hereby incorporated herein by reference.

BACKGROUND OF THE INVENTION

1. Field of the Invention

The present invention relates to a piezoelectric device, and more specifically to a piezoelectric device that includes a resonator including a piezoelectric body and a manufacturing method therefor.

2. Description of the Related Art

A variety of electronic components that include an elastic wave device obtained by forming a conductor pattern on a piezoelectric body have been proposed. For example, an elastic wave device disclosed in Japanese Unexamined Patent Application Publication No. 2007-60465 includes a plurality of piezoelectric bodies on which excitation electrodes are formed. The plurality of piezoelectric bodies disclosed in Japanese Unexamined Patent Application Publication No. 2007-60465 are stacked so as to be spaced apart from each other.

For example, as a first form of the device disclosed in Japanese Unexamined Patent Application Publication No. 2007-60465, a first piezoelectric body and a second piezoelectric body are stacked such that the surfaces thereof on which excitation electrodes are formed face each other and these surfaces are spaced apart from each other. In this case, the piezoelectric bodies are each supported by a support substrate. In addition, as a second form of the device disclosed in Japanese Unexamined Patent Application Publication No. 2007-60465, a first piezoelectric body is arranged on a front surface of a support substrate and a second piezoelectric body is arranged on a rear surface of the support substrate.

As electronic appliances become increasingly smaller and thinner, there is a demand for further reductions in the thickness and size of electronic devices. In this case, piezoelectric bodies used in elastic wave devices need to be made increasingly thinner. However, it is often the case that piezoelectric bodies break more easily as the piezoelectric bodies are made increasingly thinner. In particular, single crystals of lithium tantalate (LT) and lithium niobate (LN), which are widely used in elastic wave devices and have high electromechanical coupling coefficients, have a cleavage property and easily break. "Cleavage property" refers to a phenomenon in which splitting of a crystal body proceeds along a certain crystal face.

SUMMARY OF THE INVENTION

Preferred embodiments of the present invention provide thin piezoelectric devices that do not easily break. A piezoelectric device according to a preferred embodiment of the present invention includes a first functional substrate that is made of a crystalline material having piezoelectric properties and that includes a first functional conductor pattern on a front surface thereof; a second functional substrate that includes a second functional conductor pattern on a front surface thereof; and an adhesive layer that affixes a rear surface of the first functional substrate and a rear surface of the second functional substrate to each other and that applies a compressive stress to the first functional substrate in an affixed state.

With this configuration, a compressive stress is applied to the first functional substrate such that breaking of the first functional substrate, which is made of a crystalline material having piezoelectric properties, due to a cleavage property is significantly reduced or prevented. Thus, the first functional substrate is able to be made thinner and a thinner piezoelectric device is able to be realized.

In addition, a piezoelectric device according to a preferred embodiment of the present invention preferably includes a first functional substrate that is made of a crystalline material having piezoelectric properties and that includes a first functional conductor pattern on a front surface thereof; a second functional substrate that includes a second functional conductor pattern on a front surface thereof; and an adhesive layer that affixes a rear surface of the first functional substrate and a rear surface of the second functional substrate to each other. A crystal lattice spacing at the rear surface of the first functional substrate and the rear surface of the second functional substrate is smaller than a crystal lattice spacing at the front surface of the first functional substrate and the front surface of the second functional substrate.

With this configuration, a compressive stress is applied to the first functional substrate such that breaking of the first functional substrate, which is made of a crystalline material having piezoelectric properties, due to a cleavage property is significantly reduced or prevented. Thus, the first functional substrate is able to be made thinner and a thinner piezoelectric device is able to be realized.

In addition, in a piezoelectric device according to a preferred embodiment of the present invention, it is preferable that the rear surface of the first functional substrate has a higher surface roughness than the front surface of the first functional substrate. With this configuration, a situation in which an unwanted wave that is generated in the first functional substrate is superposed with the first functional conductor pattern is able to be significantly reduced or prevented. Thus, the electrical characteristics of a piezoelectric element that includes the first functional substrate are able to be improved. In addition, although cracks readily occur inside the first functional substrate from the rear surface of the first functional substrate due the rear surface being rough, the occurrence of cracks is able to be reduced or prevented by the application of a compressive stress by the adhesive layer. Thus, the reliability of a piezoelectric element that includes the first functional substrate is able to be improved.

In addition, in a piezoelectric device according to a preferred embodiment of the present invention, it is preferable that the second functional substrate be made of a material having piezoelectric properties, and that the adhesive layer apply a compressive stress to the second functional substrate in a bonded state.

With this configuration, a piezoelectric device that includes two piezoelectric elements (first piezoelectric element and second piezoelectric element) is able to be made thin.

In addition, in a piezoelectric device according to a preferred embodiment of the present invention, it is preferable that the rear surface of the second functional substrate has a higher surface roughness than the front surface of the second functional substrate.

With this configuration, the electrical characteristics and the reliability of the first piezoelectric element and the second piezoelectric element are able to be improved.

Furthermore, in a piezoelectric device according to a preferred embodiment of the present invention, the adhesive layer may include an adhesive resin and a compressive stress applying agent that generates a compressive stress via a change in state.

With this configuration, a compressive stress is applied to the first functional substrate and the second functional substrate using an adhesive resin and a compressive stress applying agent, and therefore the adhesive resin is able to be selected with a higher degree of freedom.

In addition, in a piezoelectric device according to a preferred embodiment of the present invention, the adhesive layer preferably has a higher coefficient of linear expansion than the first functional substrate.

With this configuration, the adhesive layer has a single component and is able to be handled easily.

In addition, in a piezoelectric device according to a preferred embodiment of the present invention, an elastic wave propagation speed of the adhesive layer, which applies the compressive stress, is lower than an elastic wave propagation speed of the functional substrates, and an elastic modulus of the adhesive layer, which applies the compressive stress, is lower than an elastic modulus of the functional substrates.

With this configuration, bulk waves leak into the adhesive layer from the functional substrates, and therefore reflected waves are reduced and the leaked waves are attenuated by the adhesive layer. Consequently, spurious bulk waves are able to be significantly reduced or prevented.

In addition, a piezoelectric device manufacturing method according to a preferred embodiment of the present invention includes forming a first functional conductor pattern on a front surface of a first functional substrate that is made of a material having piezoelectric properties, and forming a second functional conductor pattern on a front surface of a second functional substrate. The piezoelectric device manufacturing method includes a step of applying a compressive stress to the first functional substrate by bonding a rear surface of the first functional substrate and a rear surface of the second functional substrate to each other.

With this manufacturing method, a thin piezoelectric device that does not easily break is able to be easily manufactured.

In addition, in a piezoelectric device manufacturing method according to a preferred embodiment of the present invention, the second functional substrate is preferably made of a material having piezoelectric properties and a compressive stress is also applied to the second functional substrate in the step of applying a compressive stress.

With this manufacturing method, a thin piezoelectric device that includes a plurality of piezoelectric elements and that does not easily break is able to be easily manufactured.

According to preferred embodiments of the present invention, thin piezoelectric devices that do not easily break are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
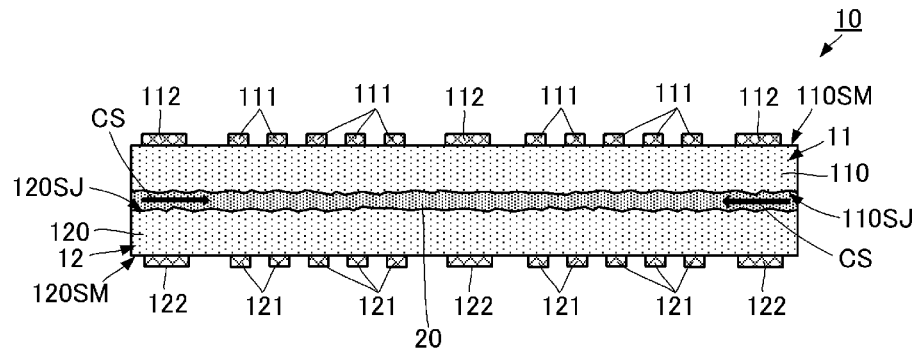
FIG. 1 is a side view illustrating the configuration of a piezoelectric device according to a first preferred embodiment of the present invention.

Piezoelectric devices and methods of manufacturing thereof according to preferred embodiments of the present invention will be described with reference to the drawings. FIG. 1 is a side view illustrating the configuration of a piezoelectric device according to a first preferred embodiment of the present invention.

As illustrated in FIG. 1, a piezoelectric device 10 preferably includes a first piezoelectric element 11, a second piezoelectric element 12 and an adhesive layer 20.

The first piezoelectric element 11 includes a piezoelectric substrate 110. The piezoelectric substrate 110 corresponds to a first functional substrate. The piezoelectric substrate 110 is made of a crystalline material that has piezoelectric properties. Specifically, the piezoelectric substrate 110 is made of a lithium tantalate substrate (LT substrate) or a lithium niobate substrate (LN substrate). The thickness of the piezoelectric substrate 110 is preferably about 100 μm or less, for example. Although the thickness of the piezoelectric substrate 110 may be about 100 μm or more, the configurations of various preferred embodiments of the present application are particularly effective when the thickness is about 100 μm or less, for example.

Conductor patterns 111 and 112, which define desired circuit elements, are provided on a front surface 110SM of the piezoelectric substrate 110. The conductor patterns 111 and 112 define a first functional conductor pattern. For example, the conductor patterns 111 preferably have a comb-tooth shape in the case where a piezoelectric resonator is defined by the first piezoelectric element 11. The conductor patterns 112 are conductors that lead out the conductor patterns 111. The conductor patterns 111 and 112 are preferably formed by performing resist patterning, EB vapor deposition film formation of aluminum (Al)-based electrode films, a lift-off process or the like, for example.

A rear surface 110SJ of the piezoelectric substrate 110 is preferably rougher than the front surface 110SM of the piezoelectric substrate 110. Specifically, the front surface 110SM has an Ra of about 1 nm or less, whereas the rear surface 110SJ has an Ra of about 10 nm or more, for example. The rear surface 110SJ may have an Ra of about 5 nm or more, but preferably has an Ra of about 10 nm or more, for example. The following effect is obtained by making the front surface 110SM of the piezoelectric substrate 110 be a mirror surface having little unevenness and the rear surface 110SJ of the piezoelectric substrate 110 be an uneven surface in this way. The propagation characteristics of an elastic wave that propagates along the front surface of the piezoelectric substrate 110 are able to be improved due to the front surface 110SM being a mirror surface. As a result of the rear surface 110SJ being an uneven surface, a bulk wave, which is an unwanted wave with respect to an elastic wave that propagates along the piezoelectric substrate 110, is able to be scattered by the rear surface 110SJ of the piezoelectric substrate 110. Thus, an unwanted vibration is able to be significantly reduced or prevented and the propagation characteristics of an elastic wave are able to be improved.

In an elastic wave filter, the above-described effect is significant. This is because the filter characteristics of an elastic wave filter are degraded by bulk waves that are reflected by the rear surface of a piezoelectric substrate, and therefore, it is preferable to significantly reduce or prevent such bulk waves. However, as described above, the rear surface 110SJ is an uneven surface in various preferred embodiments of the present invention, and as a result, a bulk wave, which is an unwanted wave with respect to an elastic wave that propagates along the piezoelectric substrate 110, is able to be scattered by the rear surface 110SJ of the piezoelectric substrate 110. Therefore, as a result, ripples and spurious are able to be reduced or prevented with respect to a propagating elastic wave and the propagation characteristics of an elastic wave are able to be improved.

The second piezoelectric element 12 includes a piezoelectric substrate 120. The piezoelectric substrate 120 corresponds to a second functional substrate. Similarly to the piezoelectric substrate 110, the piezoelectric substrate 120 is made of a material that has piezoelectric properties.

Conductor patterns 121 and 122, which define desired circuit elements, are provided on a front surface 120SM of the piezoelectric substrate 120. The conductor patterns 121 and 122 correspond to a second functional conductor pattern. For example, the conductor patterns 121 preferably have a comb-tooth shape in the case where a piezoelectric resonator is defined by the second piezoelectric element 12. The conductor patterns 122 are conductors that lead out the conductor patterns 121. The conductor patterns 121 and 122 are preferably formed by performing resist patterning, EB vapor deposition film formation of aluminum (Al)-based electrode films, a lift-off process or the like, for example.

A rear surface 120SJ of the piezoelectric substrate 120 is preferably rougher than the front surface 120SM of the piezoelectric substrate 120. Specifically, the front surface 120SM preferably has an Ra of about 1 nm or less, whereas the rear surface 120SJ preferably has an Ra of about 10 nm or more, for example. The rear surface 120SJ may have an Ra of about 5 nm or more, but preferably has an Ra of about 10 nm or more, for example. The following effect is obtained by making the front surface 120SM of the piezoelectric substrate 120 be a mirror surface having little unevenness and the rear surface 120SJ of the piezoelectric substrate 120 be an uneven surface. The propagation characteristics of an elastic wave that propagates along the front surface of the piezoelectric substrate 120 are able to be improved due to the fact that the front surface 120SM is a mirror surface. The rear surface 120SJ is an uneven surface, and as a result, a bulk wave, which is an unwanted wave with respect to an elastic wave that propagates along the piezoelectric substrate 120, is able to be scattered by the rear surface 120SJ of the piezoelectric substrate 120. Thus, an unwanted vibration is able to be reduced or prevented and the propagation characteristics of an elastic wave are able to be improved.

In an elastic wave filter, the above-described effect is significant. This is because, in an elastic wave filter, the filter characteristics are degraded by bulk waves that are reflected by the rear surface of a piezoelectric substrate, and therefore, it is preferable to significantly reduce or prevent such bulk waves. However, as described above, the rear surface 120SJ is an uneven surface in a preferred embodiment of the present invention, and as a result, a bulk wave, which is an unwanted wave with respect to an elastic wave that propagates along the piezoelectric substrate 120, is able to be scattered by the rear surface 120SJ of the piezoelectric substrate 120. Therefore, as a result, ripples and spurious wave reflections are able to be reduced for a propagating elastic wave and the propagation characteristics of an elastic wave are able to be improved.

The adhesive layer 20 adheres the rear surface 110SJ of the piezoelectric substrate 110 and the rear surface 120SJ of the piezoelectric substrate 120 to each other. The adhesive layer 20 is preferably realized in any one of the following example structures.

(1) The adhesive layer 20 is made of an adhesive resin and a compressive stress applying material that generates a compressive stress upon undergoing a change in state. The compressive stress applying material is, for example, an alumina deposited film. The compressive stress applying material is preferably provided on the rear surface 110SJ of the piezoelectric substrate 110 and on the rear surface 120SJ of the piezoelectric substrate 120. Thus, the rear surface 110SJ of the piezoelectric substrate 110 and the rear surface 120SJ of the piezoelectric substrate 120, on which the compressive stress applying material is provided, are adhered to each other by the adhesive resin. With this configuration, volumetric shrinkage occurs the instant the sprayed alumina particles cool, and therefore, a compressive stress acts on the rear surface 110SJ of the piezoelectric substrate 110 and the rear surface 120SJ of the piezoelectric substrate 120 on which the deposited film is provided. The rear surface 110SJ of the piezoelectric substrate 110 and the rear surface 120SJ of the piezoelectric substrate 120 are adhered to each other by the adhesive resin in this state. Thus, the piezoelectric substrate 110 and the piezoelectric substrate 120 are preferably adhered to each other in a state where a compressive stress CS, which is indicated by arrows in FIG. 1, acts. At this time, it is preferable that the adhesive resin has a high elastic modulus, and in particular, the elastic modulus is preferably about 300 MPa or higher, for example. Thus, the state in which a compressive stress acts on the piezoelectric substrates 110 and 120 is able to be easily maintained. In addition, since a typical adhesive resin is able to be used, the adhesive layer is able to be easily formed.

"Compressive stress" refers to a force that acts in a direction in which the piezoelectric substrates 110 and 120, which are adjacent to the adhesive layer, shrink and is indicated by CS in FIG. 1.

(2) The adhesive layer 20 is made of only an adhesive resin. In this case, when a thermally curable resin is selected as the adhesive resin, an effect caused by removal of a solvent contained in the resin, and polymerization and cross linking of the resin proceed when the resin is thermally cured, and as a result, volumetric shrinkage occurs. The piezoelectric substrates 110 and 120 are able to be adhered to each other while a state of a compressive stress being applied to the piezoelectric substrates 110 and 120 is maintained by using an adhesive resin having the above-described material characteristics. With this arrangement, a configuration in which the adhesive layer 20 includes a single component and the piezoelectric substrates 110 and 120 are adhered to each other while a compressive stress still being applied is able to be easily implemented.

In addition, when the compressive stress is applied to the piezoelectric substrates 110 and 120, the crystal lattice spacing of the piezoelectric substrates at the surfaces where the compressive stress is acting (i.e., the surfaces 110SJ and 120SJ on the sides where the IDT electrodes are not provided) becomes smaller than that at the surfaces of the piezoelectric substrates where the compressive stress is not applied (i.e., surfaces 110SM and 120SM on the sides where the IDT electrodes are provided).

It is preferable that the elastic wave propagation speed of the adhesive layer 20 be lower than the elastic wave propagation speed of the piezoelectric substrates 110 and 120. In addition, it is preferable that the elastic modulus of the adhesive layer 20 be lower than the elastic modulus of the piezoelectric substrates 110 and 120. Due to this configuration, bulk waves leak into the adhesive layer 20, and therefore reflected waves are reduced and the leaked waves are attenuated by the adhesive layer 20. Consequently, bulk waves, which are spurious reflection waves, are able to be significantly reduced or prevented.

The following operational effects are obtained by adopting the configuration of a preferred embodiment of the present invention described above.

(A) A configuration is adopted in which the piezoelectric substrate 110 and the piezoelectric substrate 120 are stacked one on top of the other and are adhered to each other with the adhesive layer 20 that applies a compressive stress, and therefore, the piezoelectric substrates is able to be made thinner, and as a result, the piezoelectric device 10 is able to be made thinner.

(B) Cracks are likely to occur and grow in the piezoelectric substrates 110 and 120, which have a cleavage property, if there is a state where a tensile stress is being applied thereto, whereas the occurrence and growth of cracks are significantly reduced or prevented and the piezoelectric substrates are unlikely to break in a state where a compressive stress is being applied. In particular, as illustrated in a preferred embodiment of the present invention, cracks are more likely to occur since stress is locally concentrated when the rear surfaces 110SJ and 120SJ have unevenness, but the cracks are unlikely to grow due to the cleavage property as a result of the compressive stress being applied to the piezoelectric substrates 110 and 120. Thus, a piezoelectric device 10 that does not easily break and has high reliability is able to be realized. In addition, as a result of the compressive stress being applied, the crystal lattice spacing of the substrates at the surfaces where the compressive stress is acting becomes smaller than that at the surfaces where the compressive stress is not acting.

(C) The propagation characteristics of the first piezoelectric element 11 and the propagation characteristics of the second piezoelectric element 12 are able to be improved as a result of the rear surface 110SJ of the piezoelectric substrate 110 and the rear surface 120SJ of the piezoelectric substrate 120 having unevenness. Thus, a piezoelectric device 10 is able to be realized that includes two piezoelectric elements having excellent electrical characteristics.

Figure 2:
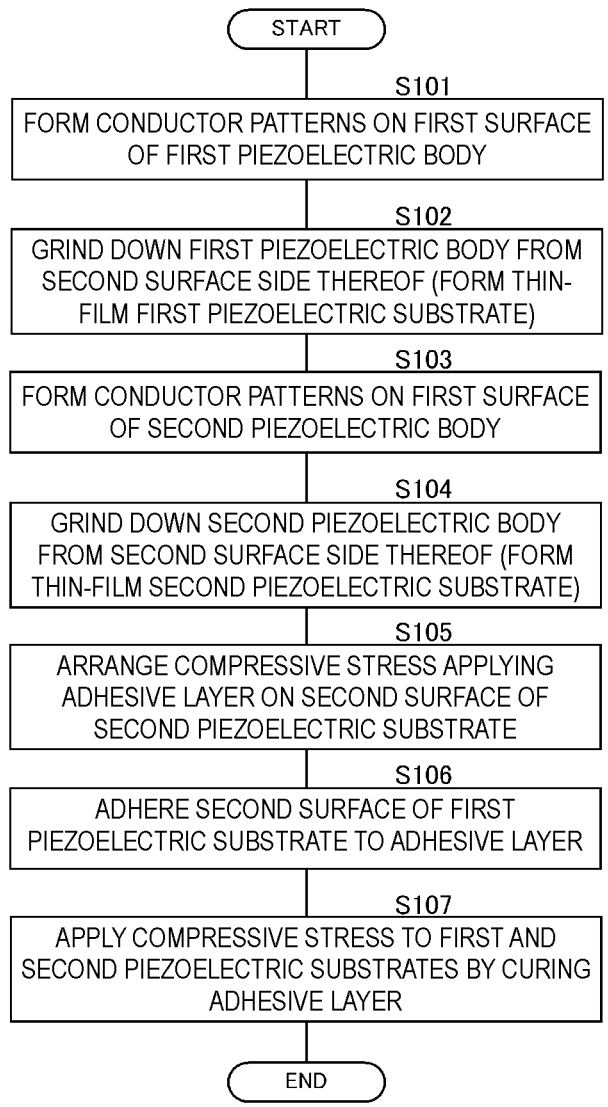
FIG. 2 is a flowchart that illustrates the steps of manufacturing a piezoelectric device according to a preferred embodiment of the present invention.

Next, a method of manufacturing a piezoelectric device according to a preferred embodiment of the present invention will be described with reference to the drawings. FIG. 2 is a flowchart that illustrates the steps of manufacturing the piezoelectric device according to a preferred embodiment of the present invention. FIG. 3 is a side view illustrating the structures that exist in each step of manufacturing a piezoelectric device according to a preferred embodiment of the present invention.

As illustrated in step S101 of FIG. 2, a first piezoelectric body 110MT is prepared and a front surface 110SM thereof is mirror finished. The conductor patterns 111 and 112 are provided on the front surface 110SM of the piezoelectric body 110MT, which has been mirror finished (refer to FIG. 3A).

Figure 3A:
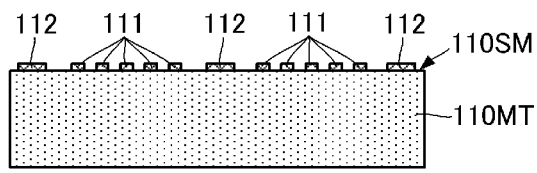
FIGS. 3A-3E are side views illustrating the structures that exist in each step of manufacturing an piezoelectric device according to a preferred embodiment of the present invention.
Figure 3B:
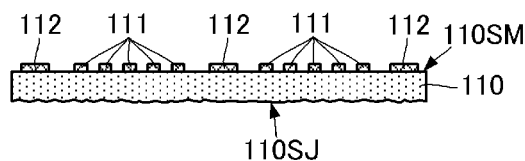

Next, as illustrated in step S102 of FIG. 2, the first piezoelectric body 110MT is made thinner by being ground down from the rear surface side thereof, and as a result, the piezoelectric substrate 110 is provided (refer to FIG. 3B).

As illustrated in step S103 of FIG. 2, a second piezoelectric body 120MT is prepared and a front surface 120SM thereof is mirror finished. The conductor patterns 121 and 122 are formed on the front surface 120SM of the piezoelectric body 120MT, which has been mirror finished. As illustrated in step S104 of FIG. 2, the second piezoelectric body 120MT is made thinner by being ground down from the rear surface side thereof, and as a result, the piezoelectric substrate 120 is formed.

Figure 3C:
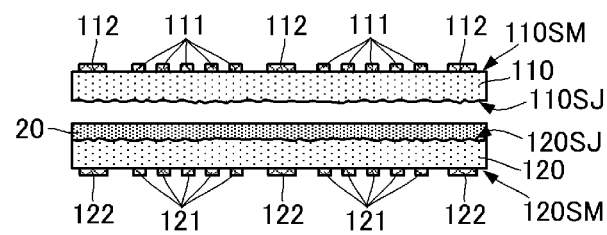

As illustrated in step S105 of FIG. 2, the adhesive layer 20 is formed on the rear surface 120SJ of the piezoelectric substrate 120 (refer to FIG. 3C). The method of forming the adhesive layer 20 and the material of the adhesive layer 20 are as described above.

As illustrated in step S106 of FIG. 2, the rear surface 110SJ of the piezoelectric substrate 110 is adhered to the adhesive layer 20.

Figure 3D:
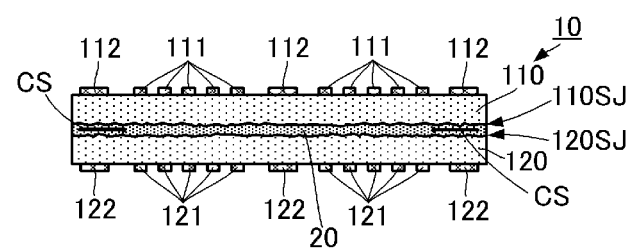

As illustrated in step S107 of FIG. 2, the adhesive layer 20 is cured in a state where the piezoelectric substrate 110 and the piezoelectric substrate 120 are adhered to each other via the adhesive layer 20. Thus, the compressive stress CS, which is indicated by the arrows in FIG. 3D, is applied to the piezoelectric substrates 110 and 120.

Thus, a piezoelectric device 10 that has excellent electrical characteristics and high reliability is able to be manufactured.

Figure 3E:
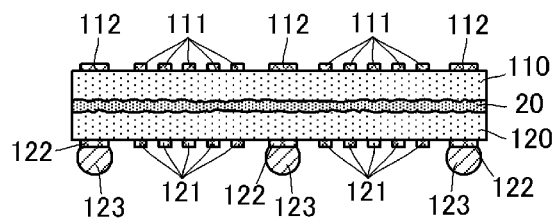

As illustrated in € FIG. 3E, electrically conductive bumps 123 are preferably provided on the thus-manufactured piezoelectric device 10. More specifically, the electrically conductive bumps 123 are preferably formed on the second piezoelectric element 12, that is, on the conductor patterns 122 on the front surface 120SM of the piezoelectric substrate 120.

The piezoelectric device 10 is preferably formed to include a large piezoelectric body (piezoelectric substrate) in which a plurality of piezoelectric devices 10 are arrayed in multiple rows and columns such that a plurality of piezoelectric devices 10 are able to be formed in one batch. The plurality of piezoelectric devices 10 are divided into individual piezoelectric devices 10 after forming the bumps 123.

A piezoelectric device having this configuration and formed using this manufacturing method is preferably used in an elastic wave device described hereafter, for example.

Figure 4:
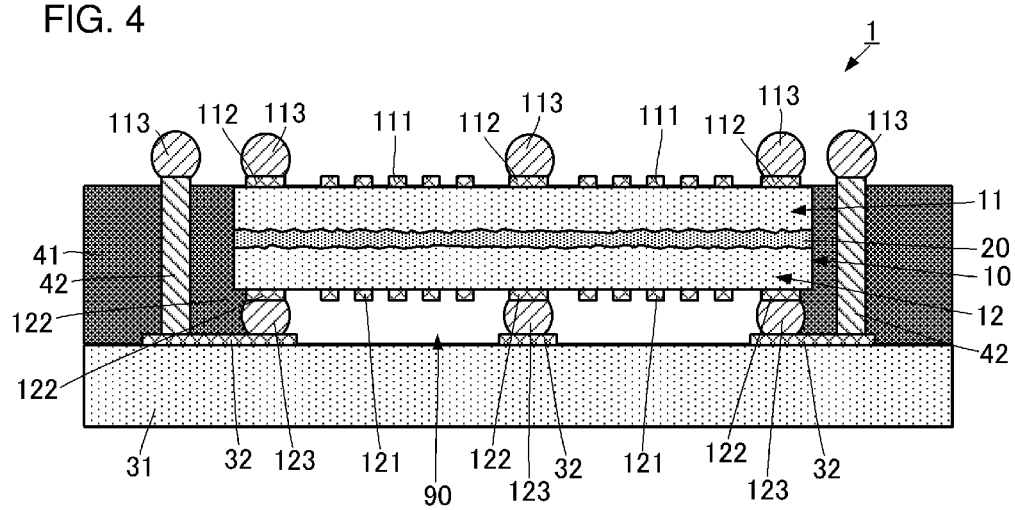
FIG. 4 is a side view illustrating the configuration of an elastic wave device according to a preferred embodiment of the present invention.

FIG. 4 is a side view illustrating the configuration of an elastic wave device according to a preferred embodiment of the present invention.

As illustrated in FIG. 4, an elastic wave device 1 electrically conductive bumps preferably includes the piezoelectric device 10 and a routing substrate 31.

Routing conductor patterns 32 are provided on one surface of the routing substrate 31.

The piezoelectric device 10 is mounted on the routing substrate 31. At this time, the second piezoelectric element 12 is positioned closer to the routing substrate 31 than the first piezoelectric element 11. The conductor patterns 122 of the second piezoelectric element 12 are connected to the routing conductor patterns 32 via the bumps 123.

The surface of the routing substrate 31 on the side on which the piezoelectric device 10 is mounted is preferably sealed using an insulating resin 41. The insulating resin 41 is provided with a large enough thickness such that the piezoelectric device 10 is able to be buried therein. At this time, a space 90 is provided in a region where the conductor patterns 121 are provided between the piezoelectric device 10 and the routing substrate 31.

Conductive vias 42 are defined in the insulating resin 41 at positions that are not superposed with the piezoelectric device 10 in a plan view of the routing substrate 31. The conductive vias 42 are connected to specific routing conductor patterns 32 and penetrate through the insulating resin 41 in the thickness direction.

External connection electrically conductive bumps 113 are preferably provided at bump formation locations on the conductor patterns 112 of the piezoelectric device 10. In addition, external connection electrically conductive bumps 113 are provided at locations where the conductive vias 42 are exposed from the insulating resin 41.

Since the above-described piezoelectric device 10 is used in the elastic wave device 1, an elastic wave device 1 that includes a plurality of piezoelectric elements is able to be made thinner. In addition, an elastic wave device 1 having high reliability is able to be realized.

Figure 5:
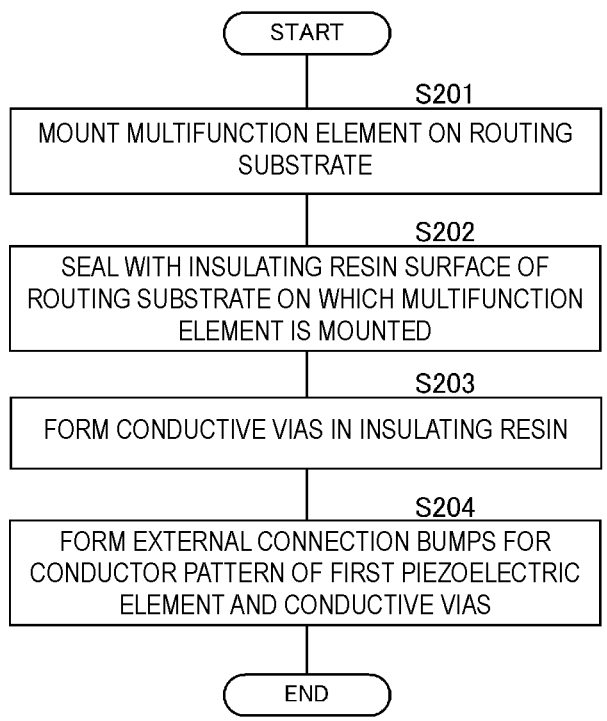
FIG. 5 is a flowchart that illustrates the steps of manufacturing an elastic wave device according to a preferred embodiment of the present invention.

Next, a method of manufacturing an elastic wave device according to a preferred embodiment of the present invention will be described while referring to the drawings. FIG. 5 is a flowchart that illustrates the steps of manufacturing an elastic wave device according to a preferred embodiment of the present invention. FIGS. 6A-6D are side views illustrating the structures that exist in each step of manufacturing an elastic wave device according to a preferred embodiment of the present invention.

Figure 6A:
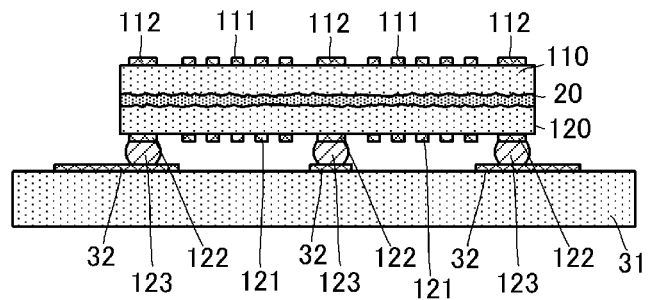
FIGS. 6A-6D are side views illustrating the structures that exist in each step of manufacturing an elastic wave device according to a preferred embodiment of the present invention.

As illustrated in step S201 of FIG. 5, the piezoelectric device 10 is mounted on the routing substrate 31 (refer to FIG. 6A). Specifically, the conductor patterns 122 of the second piezoelectric element 12 of the piezoelectric device 10 are connected to the routing conductor patterns 32 of the routing substrate 31 via the bumps 123.

Figure 6B:
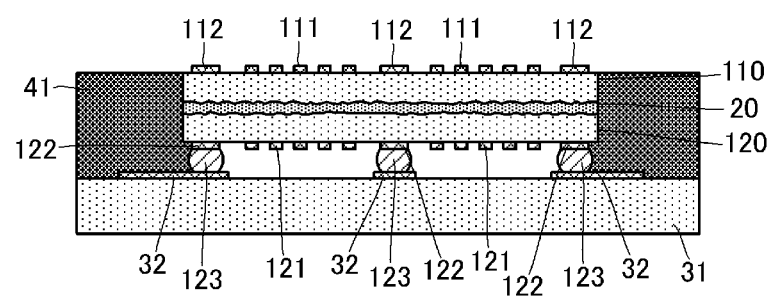

As illustrated in step S202 of FIG. 5, the surface of the routing substrate 31 on the side on which the piezoelectric device 10 is mounted is sealed with the insulating resin 41 (refer to FIG. 6B).

Figure 6C:
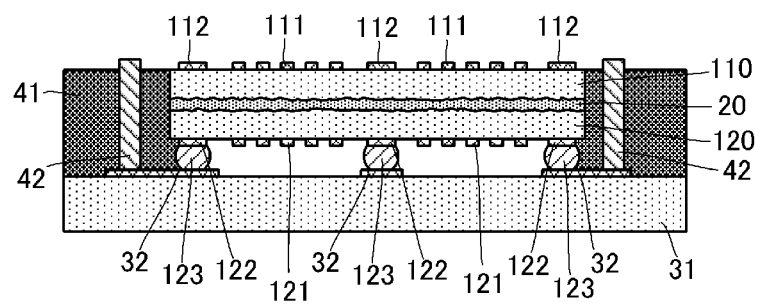

As illustrated in step S203 of FIG. 5, the conductive vias 42 are formed in the insulating resin 41 (refer to FIG. 6C). Specifically, through holes are preferably formed in the insulating resin 41. If the insulating resin 41 is made of a non-photosensitive resin, the through holes are preferably formed using laser light. If the insulating resin 41 is made of a photosensitive resin, the through holes are preferably formed using photolithography. The through holes are filled with a conductive metal, such as copper (Cu), by performing electroplating. Nickel (Ni) layers are preferably formed on the leading ends of the copper (Cu), which fills the through holes, as UMB layers.

Figure 6D:
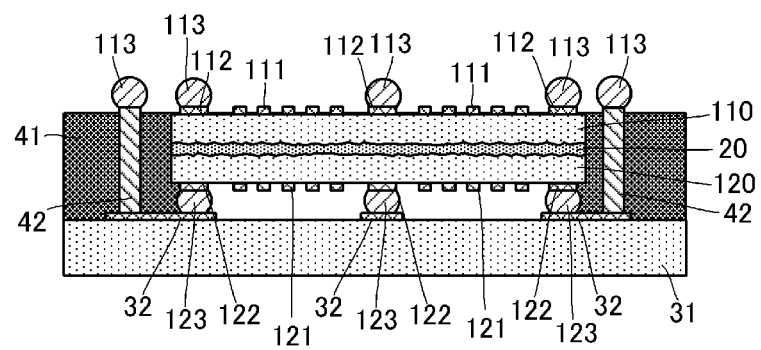

As illustrated in step S204 of FIG. 5, the external connection bumps 113 are on the conductor patterns 112 of the first piezoelectric element 11 and the conductive vias 42 (refer to FIG. 6D).

Figure 7:
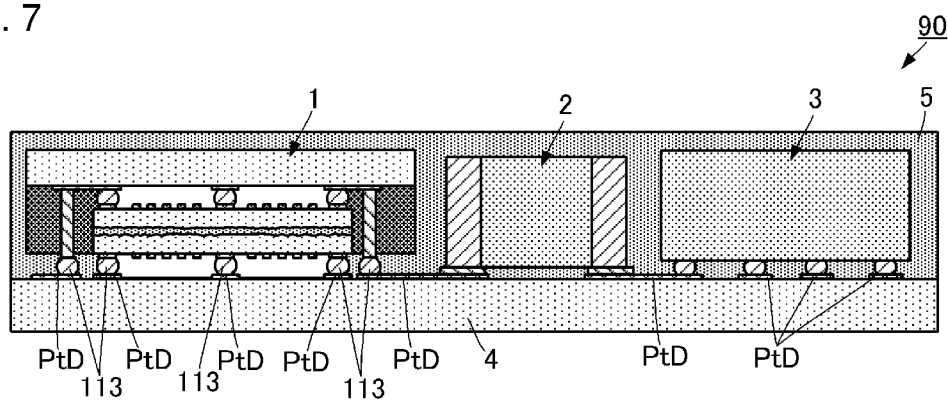
FIG. 7 is a side view illustrating the configuration of an electronic appliance module according to a preferred embodiment of the present invention.

The thus-configured elastic wave device 1 is preferably used an electronic appliance module described hereafter. FIG. 7 is a side view illustrating the configuration of an electronic appliance module according to a preferred embodiment of the present invention.

As illustrated in FIG. 7, an electronic appliance module 90 includes the elastic wave device 1, a surface-mount circuit element 2, a semiconductor element 3 and a base circuit board 4. The surface-mount circuit element 2 is preferably a resistor, a capacitor, an inductor or the like. The semiconductor element 3 is preferably a diode, a transistor, a switch or the like.

The elastic wave device 1, the surface-mount circuit element 2 and the semiconductor element 3 are mounted on conductor patterns PtD on the base circuit board 4. The conductor patterns PtD are patterns that define an electronic circuit realized by the electronic appliance module 90.

The surface of the base circuit board 4 on the side on which the various elements are mounted is sealed with insulating resin 5. The insulating resin 5 is provided with a sufficient thickness such that each of the elements is buried.

Since the above-described elastic wave device 1 is preferably used in the electronic appliance module 90, an electronic appliance module 90 that includes a plurality of piezoelectric elements is able to be made thinner. In addition, an electronic appliance module 90 that has high reliability is able to be realized.

Figure 8:
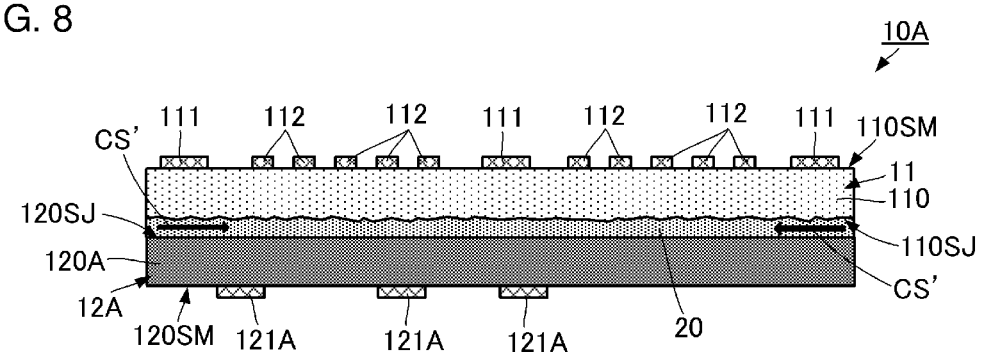
FIG. 8 is a side view illustrating the configuration of a derived example of a piezoelectric device according to a preferred embodiment of the present invention.

In the above-described preferred embodiments, a configuration has been described in which two piezoelectric substrates are affixed to each other using an adhesive layer, but a configuration may instead be adopted in which a piezoelectric substrate and a semiconductor substrate are affixed to each other with an adhesive layer. FIG. 8 is a side view illustrating the configuration of a derived example of a piezoelectric device according to a preferred embodiment of the present invention.

As illustrated in FIG. 8, a piezoelectric device 10A is obtained by replacing the second piezoelectric element 12 of the piezoelectric device 10 with a semiconductor element 12A. The rest of the configuration is preferably the same or substantially the same as that of the piezoelectric device 10 illustrated in FIG. 1.

The semiconductor element 12A preferably includes a semiconductor substrate 120A. Conductor patterns 121A are on a front surface 120SM of the semiconductor substrate 120A. A desired doping process and so forth are performed on the semiconductor substrate 120A. A rear surface 120SJ of the semiconductor substrate 120A is adhered to the first piezoelectric element 11 via the adhesive layer 20.

With this configuration as well, since a compressive stress CS' is applied to the piezoelectric substrate 110 of the first piezoelectric element 11, the above-described operational effects are able to be realized.

In the above description, although an example is given in which LT substrates or LN substrates are used as the piezoelectric substrates, it is possible to realize the operational effects of various preferred embodiments of the present invention so long as a crystalline piezoelectric material is used. Furthermore, the above description simply focused on elastic waves. Since it is particularly necessary to make a piezoelectric substrate thin in the case of a plate wave device, the configuration of this preferred embodiment would be more effective in such a case.

"Piezoelectric device" refers to an elastic wave resonator, an elastic wave filter, an elastic wave duplexer, an elastic wave multiplexer and so forth, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising: a first functional substrate that is made of a crystalline material having piezoelectric properties and that includes a first functional conductor pattern on a front surface thereof; the first functional conductor pattern includes: comb IDT electrodes and electrical patterns which provide electrical lead outs for the comb IDT electrode; a second functional substrate that includes a second functional conductor pattern on a front surface thereof and an adhesive layer that affixes a rear surface of the first functional substrate and a rear surface of the second functional substrate to each other and that applies a compressive stress to the first functional substrate in an affixed state.

2. A piezoelectric device comprising: a first functional substrate that is made of a crystalline material having piezoelectric properties and that includes a first functional conductor pattern on a front surface thereof; the first functional conductor pattern includes: comb IDT electrodes and electrical patterns which provide electrical lead outs for the comb IDT electrode; a second functional substrate that includes a second functional conductor pattern on a front surface thereof and an adhesive layer that affixes a rear surface of the first functional substrate and a rear surface of the second functional substrate to each other wherein a crystal lattice spacing at the rear surface of the first functional substrate and the rear surface of the second functional substrate is smaller than a crystal lattice spacing at the front surface of the first functional substrate and the front surface of the second functional substrate.

3. The piezoelectric device according to claim 2, wherein the rear surface of the first functional substrate has a higher surface roughness than the front surface of the first functional substrate.

4. The piezoelectric device according to claim 2, wherein the second functional substrate is made of a material having piezoelectric properties, and the adhesive layer applies a compressive stress to the second functional substrate in a bonded state.

5. The piezoelectric device according to claim 4, wherein the rear surface of the second functional substrate has a higher surface roughness than the front surface of the second functional substrate.

6. The piezoelectric device according to claim 1, wherein the adhesive layer includes:
an adhesive resin; and
a compressive stress applying agent that generates a compressive stress via a change in state.

7. The piezoelectric device according to claim 1, wherein the adhesive layer has a higher coefficient of linear expansion than the first functional substrate.

8. The piezoelectric device according to claim 1, wherein
an elastic wave propagation speed of the adhesive layer, which applies the compressive stress, is lower than an elastic wave propagation speed of the functional substrates; and
an elastic modulus of the adhesive layer, which applies the compressive stress, is lower than an elastic modulus of the functional substrates.

9. A piezoelectric device manufacturing method comprising: forming a first functional conductor pattern on a front surface of a first functional substrate that is made of a material having piezoelectric properties: the first functional conductor pattern includes: comb IDT electrodes and electrical patterns which provide electrical lead outs for the comb IDT electrode; forming a second functional conductor pattern on a front surface of a second functional substrate and applying a compressive stress to the first functional substrate by bonding a rear surface of the first functional substrate and a rear surface of the second functional substrate to each other.

10. The piezoelectric device manufacturing method according to claim 9, wherein
the second functional substrate is made of a material having piezoelectric properties; and
a compressive stress is also applied to the second functional substrate in the applying a compressive stress.

11. The piezoelectric device according to claim 1, wherein the second functional substrate is a semiconductor substrate.

12. The piezoelectric device according to claim 2, wherein
electrically conductive bumps are provided on both the front surface of the first functional substrate and the front surface of the second functional substrate.

13. The piezoelectric device manufacturing method according to claim 9, further comprising a step of forming electrically conductive bumps on both the front surface of the first functional substrate and the front surface of the second functional substrate.

14. An elastic wave device, comprising:
the piezoelectric device according to claim 2;
a routing substrate; and
electrically conductive bumps electrically connecting the piezoelectric device to the routing substrate.

15. The elastic wave device according to claim 14, wherein
lateral side surfaces of the piezoelectric device are encapsulated in insulating resin; and
conductive vias are defined in the insulating resin to connect the routing substrate to additional electrically conductive bumps.

16. An electronic appliance, comprising:
the elastic wave device according to claim 14;
a mounted circuit element;
a semiconductor element; and
a base circuit board; wherein
each of the elastic wave device, the mounted circuit element, and the semiconductor element board are positioned adjacent to one another on a surface of the base circuit board.

17. The electronic appliance according to claim 16, wherein the piezoelectric device is connected to the surface of the base circuit board through the electrically conductive bumps.

18. The piezoelectric device according to claim 1, wherein the first functional substrate is made of a lithium tantalate substrate or a lithium niobate substrate.

19. The piezoelectric device according to claim 2, wherein the first functional substrate is made of a lithium tantalate substrate or a lithium niobate substrate.

20. The piezoelectric device manufacturing method according to claim 9, wherein the first functional substrate is made of a lithium tantalate substrate or a lithium niobate substrate.

* * * * *